United States Patent
Kodama et al.

(10) Patent No.: US 11,858,092 B2
(45) Date of Patent: Jan. 2, 2024

(54) SUBSTRATE PROCESSING SYSTEM, SUBSTRATE PROCESSING METHOD AND COMPUTER-READABLE RECORDING MEDIUM

(71) Applicant: Tokyo Electron Limited, Tokyo (JP)

(72) Inventors: Munehisa Kodama, Koshi (JP); Takahiro Sakamoto, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1047 days.

(21) Appl. No.: 16/624,951

(22) PCT Filed: Jun. 7, 2018

(86) PCT No.: PCT/JP2018/021873
§ 371 (c)(1),
(2) Date: Dec. 20, 2019

(87) PCT Pub. No.: WO2018/235619
PCT Pub. Date: Dec. 27, 2018

(65) Prior Publication Data
US 2020/0139503 A1 May 7, 2020

(30) Foreign Application Priority Data
Jun. 21, 2017 (JP) .................................. 2017-121183

(51) Int. Cl.
*B24B 7/22* (2006.01)
*H01L 21/304* (2006.01)
(Continued)

(52) U.S. Cl.
CPC ................ *B24B 7/228* (2013.01); *B24B 7/04* (2013.01); *B24B 49/02* (2013.01); *B24B 49/12* (2013.01);
(Continued)

(58) Field of Classification Search
CPC ........... B24B 7/228; B24B 7/04; B24B 49/02; B24B 49/12; B24B 49/10; B24B 49/105;
(Continued)

(56) References Cited

U.S. PATENT DOCUMENTS

| | | | |
|---|---|---|---|
| 2008/0233345 A1* | 9/2008 | Allen | ...................... B24B 19/22 |
| | | | 428/116 |
| 2011/0294233 A1* | 12/2011 | Nakata | .................... H01L 22/20 |
| | | | 257/E21.53 |

(Continued)

FOREIGN PATENT DOCUMENTS

| | | | | |
|---|---|---|---|---|
| JP | 2000024918 | A * | 1/2000 | |
| JP | 2000024918 | A | 1/2000 | |

(Continued)

OTHER PUBLICATIONS

International Search Report of PCT/JP2018/021873 dated Aug. 21, 2018, 3 pages.

*Primary Examiner* — Joel D Crandall
*Assistant Examiner* — Michael A Gump
(74) *Attorney, Agent, or Firm* — Shih IP Law Group, PLLC.

(57) ABSTRACT

A substrate processing method of thinning a substrate having a protective tape attached on a front surface thereof includes measuring a thickness of the protective tape; and grinding, by using a grinder, a rear surface of the substrate held by a substrate holder.

19 Claims, 15 Drawing Sheets

(51) Int. Cl.
    *H01L 21/683* (2006.01)
    *H01L 21/66* (2006.01)
    *B24B 7/04* (2006.01)
    *B24B 49/02* (2006.01)
    *B24B 49/12* (2006.01)

(52) U.S. Cl.
    CPC ........ *H01L 21/304* (2013.01); *H01L 21/6836* (2013.01); *H01L 22/26* (2013.01); *H01L 2221/68327* (2013.01)

(58) Field of Classification Search
    CPC ..... B24B 37/10; B24B 37/005; B24B 37/013; B24B 41/044; B24B 41/061; H01L 21/304; H01L 21/6836; H01L 21/683; H01L 21/67092; H01L 21/67132; H01L 21/67253; H01L 21/68757; H01L 21/68764; H01L 22/26; H01L 22/12; H01L 2221/68327; F16C 32/0425; H02K 7/003; H02K 7/08; H02K 7/09; H02K 7/14
    USPC .............................................. 451/63, 5, 6, 41
    See application file for complete search history.

(56) References Cited

U.S. PATENT DOCUMENTS

| | | | | |
|---|---|---|---|---|
| 2012/0293028 | A1* | 11/2012 | Kim | F16C 32/0423 384/129 |
| 2016/0355927 | A1* | 12/2016 | Weaver | H01L 21/68785 |
| 2017/0095902 | A1* | 4/2017 | Yoshida | B24B 7/228 |
| 2020/0032844 | A1* | 1/2020 | Saito | H02K 7/14 |

FOREIGN PATENT DOCUMENTS

| | | | | |
|---|---|---|---|---|
| JP | 2008264913 | A | * | 11/2008 |
| JP | 2011245610 | A | | 12/2011 |
| JP | 2012115960 | A | * | 6/2012 |
| JP | 2012161848 | A | | 8/2012 |
| JP | 2012222134 | A | | 11/2012 |
| JP | 2013119123 | A | * | 6/2013 |
| JP | 2014103215 | A | | 6/2014 |
| JP | 2014226749 | A | | 12/2014 |
| JP | 2015205362 | A | | 11/2015 |
| WO | WO-2019054280 | A1 | * | 3/2019 ........... B24B 41/047 |

* cited by examiner

ND COMPUTER-READABLE RECORDING
SUBSTRATE PROCESSING SYSTEM, SUBSTRATE PROCESSING METHOD AND COMPUTER-READABLE RECORDING MEDIUM

CROSS-REFERENCE TO RELATED APPLICATION

This application claims the benefit of Japanese Patent Application No. 2017-121183 filed on Jun. 21, 2017, the entire disclosures of which are incorporated herein by reference.

The various aspects and embodiments described herein pertain generally to a substrate processing system configured to thin a substrate having a protective tape attached on a surface thereof, a substrate processing method using the substrate processing system, and a computer-readable recording medium.

TECHNICAL FIELD

Background

Recently, in a manufacturing process for a semiconductor device, a semiconductor wafer (hereinafter, simply referred to as "wafer") having devices such as a plurality of electronic circuits formed on a front surface thereof is thinned by grinding a rear surface of the wafer.

The grinding of the rear surface of the wafer is performed in a grinding apparatus which is equipped with a chuck configured to hold, for example, the front surface of the wafer; and a grinding device such as a grinding whetstone configured to grind the rear surface of the wafer held by the chuck. In this grinding apparatus, if the front surface of the wafer is directly held by the chuck, the devices on the front surface of the wafer may be damaged.

Thus, in Patent Document 1, for example, a protective tape is provided on the front surface of the wafer to protect this front surface. After the protective tape is attached, while the protective tape is being held by the chuck, the rear surface of the wafer is ground by the grinding whetstone.

PRIOR ART DOCUMENT

Patent Document 1: Japanese Patent Laid-open Publication No. 2012-222134

DISCLOSURE OF THE INVENTION

Means for Solving the Problems

In one exemplary embodiment, a substrate processing system configured to thin a substrate includes a substrate holder configured to hold the substrate; a grinder configured to perform a grinding of the substrate held by the substrate holder; a rotation shaft connected to the substrate holder and configured to rotate the substrate holder; a driving device provided independently from the rotation shaft and configured to apply a rotational driving force for rotating the substrate holder; and a driving force transmitter configured to deliver the rotational driving force by the driving device to the rotation shaft and configured not to deliver an inclination of the rotation shaft to the driving device. The substrate is ground by bringing the grinder into contact with the substrate in a state that the rotation shaft is tilted.

According to the exemplary embodiment, before the substrate is ground, the contact manner of the grinder to the substrate may be adjusted. By way of example, if the thickness of the protective tape is non-uniform within a surface thereof, the way of contact between the substrate and the grinder is adjusted based on a thickness distribution of the protective tape. Accordingly, the substrate can be thinned into a uniform thickness within a surface of the substrate.

In another exemplary embodiment, a substrate processing method of thinning a substrate includes grinding, by using a grinder, the substrate held by a substrate holder. In the grinding of the substrate, the substrate is ground by bringing the grinder into contact with the substrate while rotating the substrate held by the substrate holder by a rotation shaft connected to the substrate holder in a state that the rotation shaft is tilted. A rotation driving force for rotating the substrate holder is applied by a driving device provided independently from the rotation shaft. The rotation driving force by the driving device is delivered to the rotation shaft by a driving force transmitter, and the driving force transmitter is configured not to deliver an inclination of the rotation shaft to the driving device.

In still another exemplary embodiment, there is provided a computer-readable recording medium having stored thereon computer-executable instructions that, in response to execution, cause a substrate processing system to perform a substrate processing method.

BRIEF DESCRIPTION OF THE DRAWINGS

FIG. 4A is a transversal cross sectional view, and FIG. 4B is a longitudinal cross sectional view.

FIG. 7A illustrates the exemplary embodiment and FIG. 7B illustrates a conventional example.

FIG. 9A is a side view, and FIG. 9B is a plan view.

FIG. 18A is a transversal cross sectional view, and FIG. 18B is a longitudinal cross sectional view.

DETAILED DESCRIPTION

Figure 1:
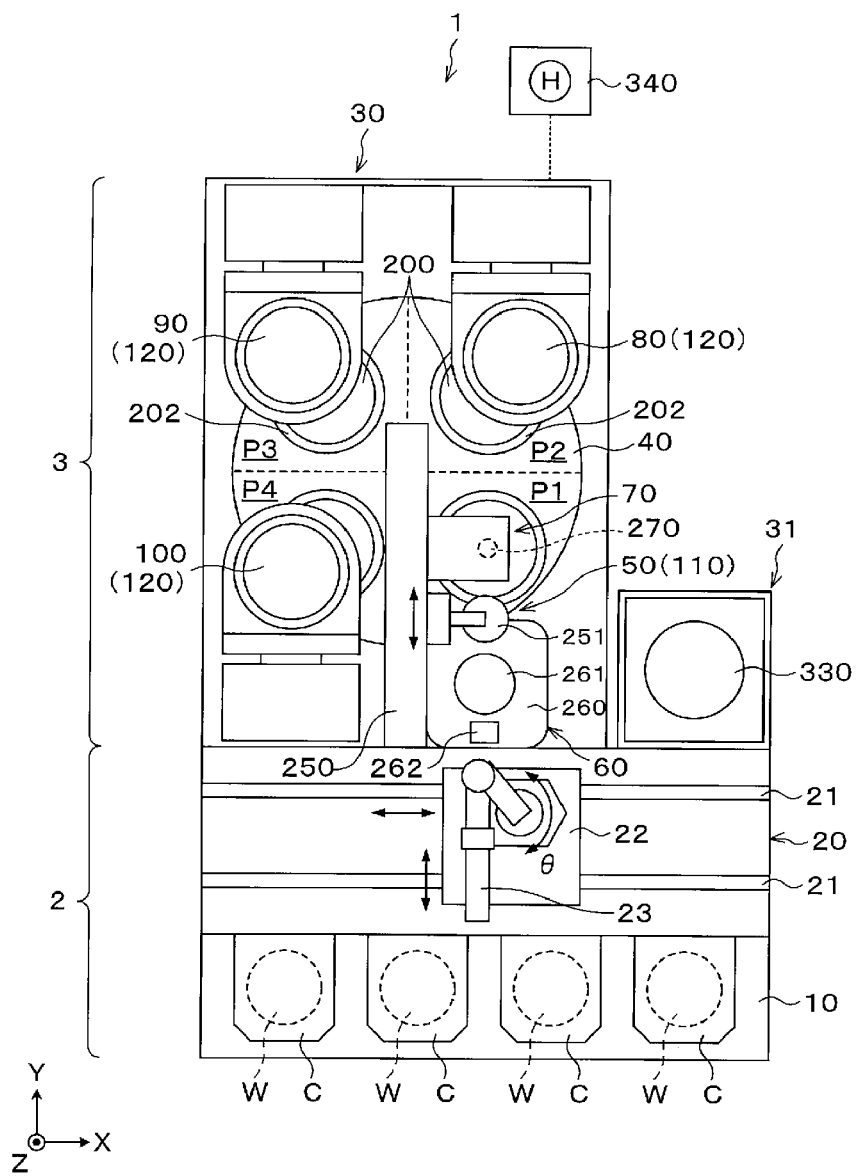
FIG. 1 is a plan view schematically illustrating a configuration of a substrate processing system according to an exemplary embodiment.

Hereinafter, exemplary embodiments will be described with reference to the accompanying drawings. In the specification and the drawings, parts having substantially same functions and configurations will be assigned same reference numerals, and redundant description thereof will be omitted.

<Substrate Processing System>

First, a configuration of a substrate processing system according to an exemplary embodiment will be described. FIG. 1 is a plan view schematically illustrating a configuration of a substrate processing system 1. In the following, in order to clarify positional relationships, the X-axis, Y-axis and Z-axis which are orthogonal to each other will be defined. The positive Z-axis direction will be regarded as a vertically upward direction.

Figure 2:
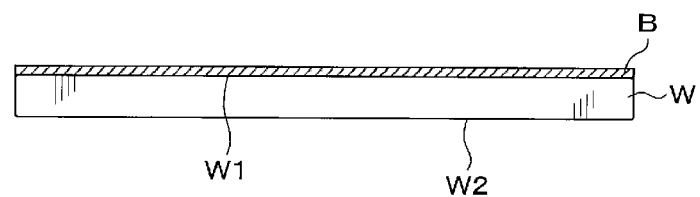
FIG. 2 is an explanatory diagram illustrating a schematic structure of a wafer.

In the substrate processing system 1 according to the present exemplary embodiment, a wafer W as a substrate, shown in FIG. 2, is thinned. The wafer W is a semiconductor wafer such as, but not limited to, a silicon wafer or a compound semiconductor wafer. A device (not shown) is formed on a front surface W1 of the wafer W, and a protective tape B for protecting the device is attached on the front surface W1. The wafer W is thinned as preset processings such as grinding and polishing are performed on a rear surface W2 of the wafer W.

The substrate processing system 1 includes a carry-in/out station 2 and a processing station 3 connected as a single body. The carry-in/out station 2 is configured as a carry-in/out section in which a cassette C, which is capable of accommodating therein a plurality of wafers W, is carried in/out from/to the outside. The processing station 3 is equipped with various kinds of processing apparatuses configured to perform preset processings on the wafer W.

The carry-in/out station 2 is equipped with a cassette placing table 10. In the shown example, the cassette placing table 10 is configured to be capable of holding a plurality of, for example, four cassettes C in series in the X-axis direction.

Further, the carry-in/out station 2 includes a wafer transfer area 20 provided adjacent to the cassette placing table 10. A wafer transfer device 22 configured to be movable on a transfer path 21 extending in the X-axis direction is provided in the wafer transfer area 20. The wafer transfer device 22 is equipped with a transfer arm 23 configured to be movable in the horizontal direction and the vertical direction and pivotable around a horizontal axis and a vertical axis (θ direction), and is capable of transferring, with this transfer arm 23, the wafers W between each cassette C on the cassette placing table 10 and respective apparatuses 30 and 31 of the processing station 3 to be described later. That is, the carry-in/out station 2 is configured to be capable of carrying the wafers W into/from the processing station 3.

Within the processing station 3, the processing apparatus 30 configured to perform various processings such as grinding and polishing on the wafer W to thin the wafer W and the cleaning apparatus 31 configured to clean the wafer W processed by the processing apparatus 30 are arranged toward the positive X-axis direction from the negative X-axis direction.

The processing apparatus 30 includes a turntable 40, a transfer unit 50, an alignment unit 60, a cleaning unit 70, a rough grinding unit 80 as a rough grinder, a fine grinding unit 90 as a finishing grinder, a gettering layer forming unit 100, a tape thickness measuring unit 110 as a tape thickness measurer and a relative thickness measuring unit 120 as a relative thickness measurer.

(Turntable)

The turntable 40 is configured to be rotated by a rotating device (not shown). Four chucks 200 as substrate holders each configured to attract and hold the wafer W are provided on the turntable 40. The chucks 200 are arranged on a circle concentric with the turntable 40 at a regular distance, that is, an angular distance of 90 degrees therebetween. The four chucks 200 can be moved to four processing positions P1 to P4 as the turntable 40 is rotated.

In the present exemplary embodiment, the first processing position P1 is a position at a positive X-axis and negative Y-axis side of the turntable 40, and the cleaning unit 70 is disposed thereat. Further, the alignment unit 60 is disposed at a negative Y-axis side of the first processing position P1. The second processing position P2 is a position at a positive X-axis and positive Y-axis side of the turntable 40, and the rough grinding unit 80 is disposed thereat. The third processing position P3 is a position at a negative X-axis and positive Y-axis side of the turntable 40, and the fine grinding unit 90 is disposed thereat. The fourth processing position P4 is a position at a negative X-axis and negative Y-axis side of the turntable 40, and the gettering layer forming unit 100 is disposed thereat.

(Chuck)

Figure 3:
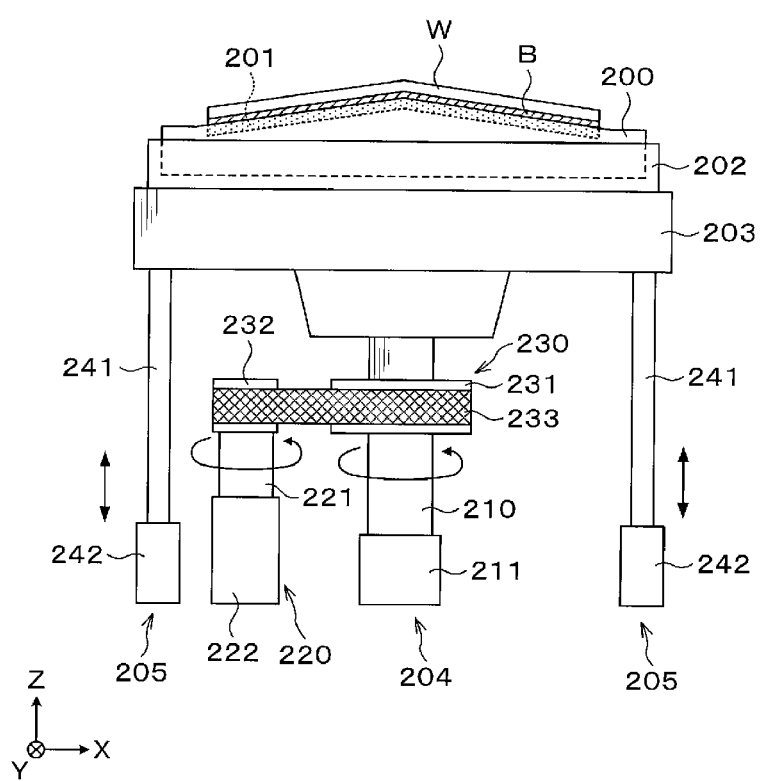
FIG. 3 is an explanatory diagram schematically illustrating a chuck, a rotating device and an adjusting device.

As depicted in FIG. 3, a front surface of each chuck 200, that is, a holding surface of the wafer W has a protruding shape with a central portion protruding higher than an end portion thereof, when viewed from the side. In a grinding processing (rough grinding and fine grinding), a ¼ arc portion of a grinding whetstone 280 (290) to be described later comes into contact with the wafer W. Further, in the polishing processing, a ¼ arc portion of a polishing whetstone 300 to be described later comes into contact with the wafer W. The front surface of the chuck 200 is formed to have the protruding shape and the wafer W is attracted to conform to this front surface of the chuck 200 so that the wafer W is ground and polished into a uniform thickness.

By way of example, a porous chuck is used as the chuck 200. A porous 201 as a porous body having a multiple number of holes therein is provided on the surface of the chuck 200. The porous 201 may be made of various kinds of materials as long as they are porous. By way of non-limiting example, the porous 201 may be made of carbon, alumina, silicon carbide, or the like. By suctioning the wafer W via the porous 201 with a suction mechanism (not shown), the wafer W is attracted to and held by the chuck 200.

The chuck 200 is held on a chuck table 202. The chuck 200 and the chuck table 202 are supported on a base 203. The base 203 is equipped with a rotating device 204 configured to rotate the chuck 200, the chuck table 202 and the base 203; and an adjusting device 205 as an adjuster configured to adjust an inclination of the chuck 200, the chuck table 202 and the base 203.

The rotating device 204 is equipped with: a rotation shaft 210 configured to rotate the chuck 200; a driving unit 220 configured to apply a rotational driving force when rotating the chuck 200; and a driving force transmitter 230 configured to transmit the rotational driving force applied by the driving unit 220 to the rotation shaft 210. The rotation shaft 210 is fixed at a central portion of a bottom of the base 203. Further, the rotation shaft 210 is rotatably supported at a supporting table 211. The chuck 200 is rotated around this rotation shaft 210.

The driving unit 220 is provided independently from the rotation shaft 210. The driving unit 220 is equipped with a driving shaft 221; and a motor 222 configured to rotate the driving shaft 221.

Figure 4A:
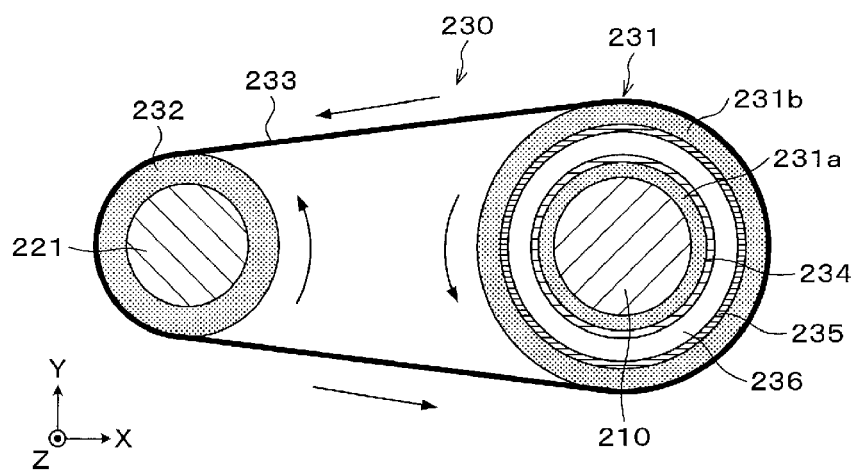
FIG. 4A and FIG. 4B are explanatory diagrams schematically illustrating a driving force transmitter.
Figure 4B:
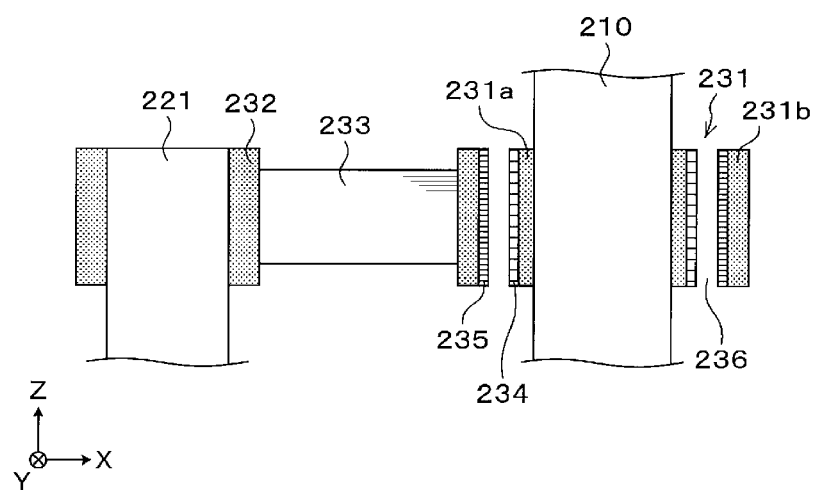

As shown in FIG. 3 and FIG. 4A and FIG. 4B, the driving force transmitter 230 includes a driven pulley 231 provided at the rotation shaft 210, a driving pulley 232 provided at the driving shaft 221 and a belt 233 wound around the driven pulley 231 and the driving pulley 232. The rotational driving force applied by the driving unit 220 is delivered to the rotation shaft 210 via the driving pulley 232, the belt 233 and the driven pulley 231.

The driven pulley 231 is divided into an inner driven pulley 231a fixed at an outer surface of the rotation shaft 210 and an outer driven pulley 231b provided at an outside of the inner driven pulley 231a. An inner magnet 234 as a first driving force transmitter is provided on an outer surface of the inner driven pulley 231a, and an outer magnet 235 as a second driving force transmitter is provided on an inner surface of the outer driven pulley 231b. A hollow portion 236 is formed between the inner magnet 234 and the outer magnet 235. With this configuration, the driving force transmitter 230 transmits the rotational driving force by the driving unit 220 to the rotation shaft 210 through a non-contact type magnet drive mechanism. That is, the rotation shaft 210 at the driven side and the driving unit 220 at the driving side are separated and configured to be independent from each other.

Further, by providing the hollow portion 236 as mentioned above, vibration and heat of the motor 222 are not delivered to the chuck 200 to affect it. In such a case, the wafer W held on the chuck 200 can be appropriately ground.

Figure 5:
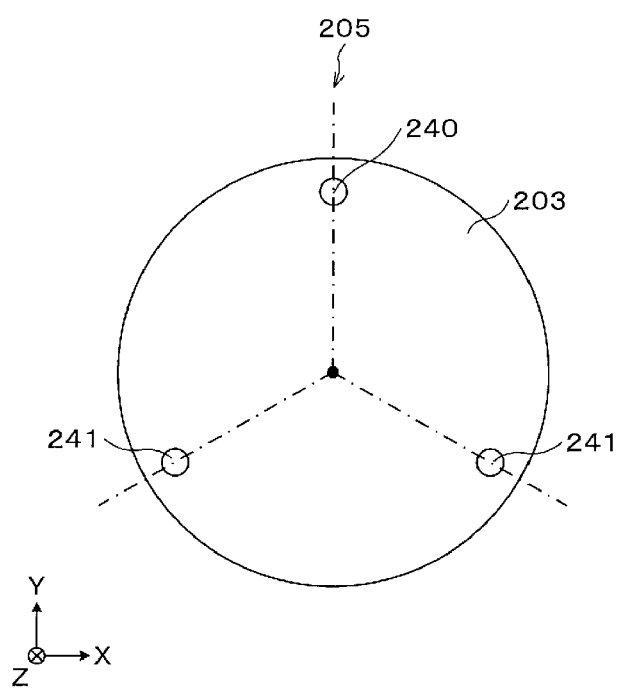
FIG. 5 is an explanatory diagram illustrating a layout of a fixed shaft and adjustment shafts of the adjusting device.

As depicted in FIG. 3 and FIG. 5, the adjusting device 205 includes a single fixed shaft 240 and two adjustment shafts 241. The fixed shaft 240 and the adjustment shafts 241 are concentrically arranged at an outer peripheral portion of the base 203 at a regular distance therebetween. For example, a ball screw is used as the adjustment shaft 241, and a motor 242 configured to rotate the adjustment shaft 241 is connected to the adjustment shaft 241. The adjustment shaft 241 is moved in a vertical direction while being rotated by the motor 242, thus moving the base 203 in the vertical direction. As the two adjustment shafts 241 are respectively moved in the vertical direction with respect to the fixed shaft 240, an inclination of the chuck 200 is adjusted via the base 203.

Further, the number and the layout of the adjustment shafts 241 are not limited to the shown example as long as two or more adjustment shafts are provided. By way of example, the fixed shaft 240 may be omitted, and only the adjustment shafts 241 may be provided. Furthermore, the configuration of the adjusting device 205 is not limited to the shown example. Instead of the adjustment shaft 241 implemented by the ball screw and the motor 242, a piezoelectric element, for example, may be used.

Figure 6:
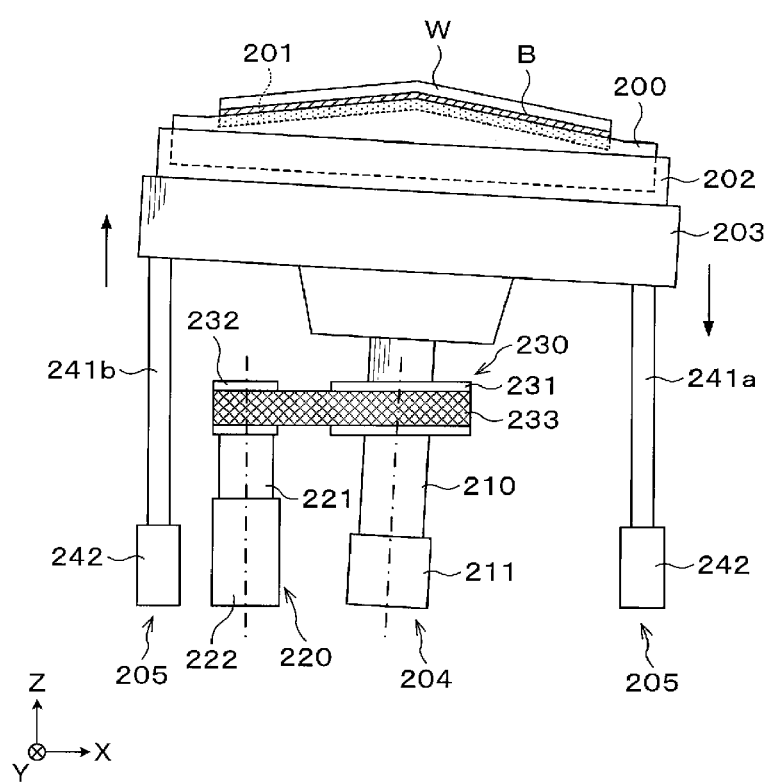
FIG. 6 is an explanatory diagrams illustrating a state in which the chuck is tilted.

As illustrated in FIG. 6, for example, in case of adjusting the inclination of the chuck 200 by moving one adjustment shaft 241a downwards and the other adjustment shaft 241b upwards, the rotation shaft 210 is also inclined from the vertical direction. This inclination of the rotation shaft 210 is absorbed by the hollow portion 236, and thus not delivered to the driving unit 220.

Figure 7A:
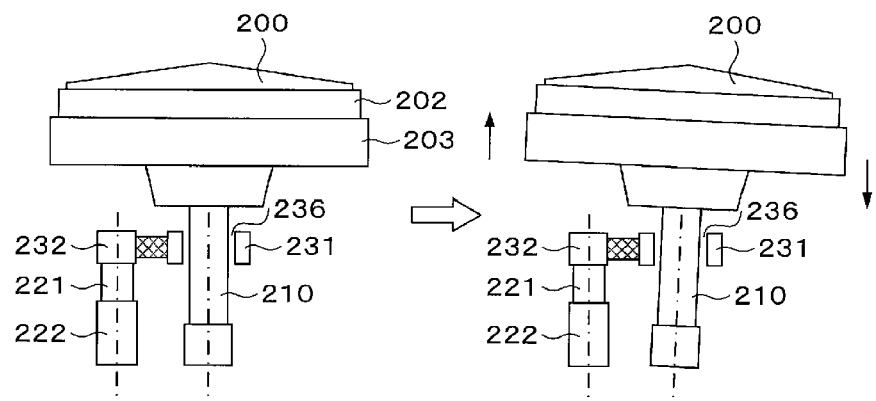
FIG. 7A and FIG. 7B are explanatory diagrams illustrating states in which the chuck is being tilted.
Figure 7B:
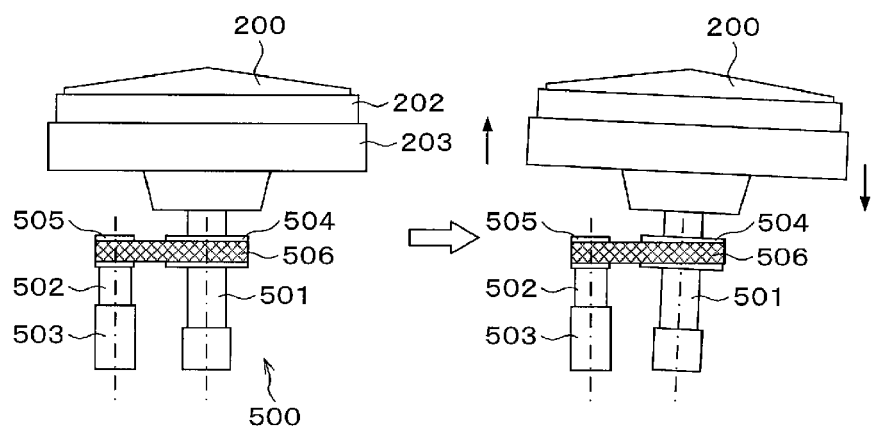

An operation of the rotating device 204 when the chuck 200 is tilted by the adjusting device 205 as stated above will be further explained in comparison with a conventional example. FIG. 7A and FIG. 7B are diagrams schematically illustrating operations of rotating devices: FIG. 7A illustrates an operation of the rotating device 204 according to the present exemplary embodiment, and FIG. 7B illustrates an operation of a rotating device 500 in the conventional example.

As shown in FIG. 7B, the rotating device 500 of the conventional example includes a rotation shaft 501, a driving shaft 502, a motor 503, a driven pulley 504, a driving pulley 505 and a belt 506. A rotational driving force by the motor 503 is delivered to the rotation shaft 501 via the driving shaft 502, the driving pulley 505, the belt 506 and the driven pulley 504. In the rotating device 500 of the conventional example, the driven pulley 504 does not have such a hollow portion as provided in the present exemplary embodiment. Therefore, if the chuck 200 is tilted, the driven pulley 504 is also tilted, following the rotation shaft 501. Accordingly, the driven pulley 504 and the belt 506 do not come into appropriate contact with each other, so that the belt 506 becomes abnormal. Furthermore, since a tension applied to the belt 506 fluctuates, the rotation becomes instable.

In contrast, in the present exemplary embodiment shown in FIG. 7A, even if the rotation shaft 210 is tilted when the chuck 200 is tilted, the inclination of the rotation shaft 210 is absorbed by the hollow portion 236 and thus not delivered to the driving unit 220. Therefore, the rotation is stable.

Moreover, if the belt 506 and the rotation shaft 501 are directly connected as shown in FIG. 7B, vibration of the motor 503 or the belt 506 is delivered to the rotation shaft 501, resulting in instable rotation. In the present exemplary embodiment shown in FIG. 7A, however, since the belt 233 and the rotation shaft 210 are separated through the hollow portion 236 as stated above, the vibration of the motor 222 or the belt 233 is not delivered to the rotation shaft 210, so that the rotation is stabilized.

(Transfer Unit)

As illustrated in FIG. 1, the transfer unit 50 is configured to be movable on a transfer path 250 extending in the Y-axis direction. The transfer unit 50 has a transfer arm 251 configured to be movable in the horizontal direction and the vertical direction and pivotable around a vertical axis (θ direction), and is capable of transferring the wafer W between the alignment unit 60 and the chuck 200 at the first processing position P1 with this transfer arm 251.

The alignment unit 60 is configured to adjust a direction of the wafer W before being processed in the horizontal direction. The alignment unit 60 is equipped with a base 260, a spin chuck 261 configured to hold and rotate the wafer W; and a detector 262 configured to detect a notch of the wafer W. A position of the notch of the wafer W is detected by the detector 262 while the wafer W held by the spin chuck 261 is being rotated, and by adjusting the position of the notch, the direction of the wafer W in the horizontal direction is adjusted.

(Cleaning Unit)

The cleaning unit 70 is configured to clean the rear surface W2 of the wafer W. The cleaning unit 70 is disposed above the chuck 200, and is equipped with a nozzle 270 configured to supply a cleaning liquid, for example, pure water onto the rear surface W2 of the wafer W. The cleaning liquid is supplied from the nozzle 270 while the wafer W held by the chuck 200 is being rotated. The supplied cleaning liquid is diffused on the rear surface W2 of the wafer W, so that the rear surface W2 is cleaned. Further, the cleaning unit 70 may further have a function of cleaning the chuck 200. In such a case, the cleaning unit 70 may be equipped with, for example, a nozzle (not shown) configured to supply the cleaning liquid to the chuck 200 and a stone (not shown) configured to come into contact with the chuck 200 and clean the chuck 200 physically.

(Rough Grinding Unit)

Figure 8:
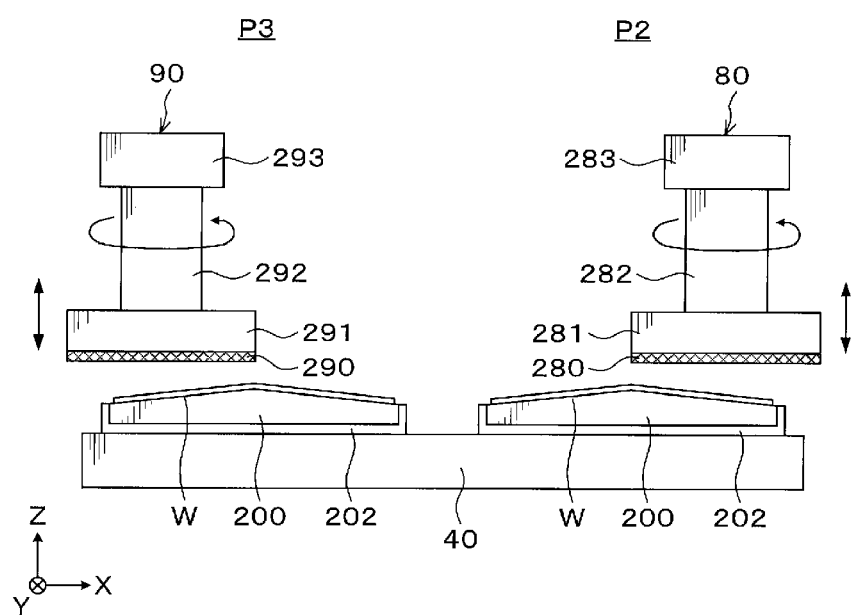
FIG. 8 is an explanatory diagram illustrating a schematic configuration of a processing apparatus.

The rough grinding unit 80 is configured to grind the rear surface W2 of the wafer W roughly. As depicted in FIG. 8, the rough grinding unit 80 includes a base 281 and the grinding whetstone 280 supported at the base 281. The base 281 is connected to a driver 283 via a spindle 282. The driver 283 incorporates, for example, a motor (not shown), and is configured to move the grinding whetstone 280 and the base 281 in the vertical direction and rotate them. By respectively rotating the chuck 200 and the grinding whetstone 280 while keeping the wafer W held by the chuck 200 in contact with the ¼ arc portion of the grinding whetstone 280, the rear surface W2 of the wafer W is roughly ground. At this time, a grinding liquid, for example, water is supplied onto the rear surface W2 of the wafer W. Further, in the present exemplary embodiment, though the grinding whetstone 280 is used as a grinding member for the rough grinding, the grinding member is not limited thereto. By way of non-limiting example, the grinding member may be a non-woven fabric containing abrasive grains, or the like.

(Fine Grinding Unit)

The fine grinding unit 90 is configured to grind the rear surface W2 of the wafer W finely. A configuration of the fine grinding unit 90 is substantially the same as the configuration of the rough grinding unit 80, and the find grinding unit 90 is equipped with the grinding whetstone 290, a base 291, a spindle 292 and a driver 293. Here, however, a particle size of the grinding whetstone 290 for the fine grinding is smaller than that of the grinding whetstone 280 for the rough grinding. By respectively rotating the chuck 200 and the grinding whetstone 290 while supplying the grinding liquid onto the rear surface W2 of the wafer W held by the chuck 200 in the state that the rear surface W2 of the wafer W is in contact with the ¼ arc portion of the grinding whetstone 290, the rear surface W2 of the wafer W is ground. Like the grinding member for the rough grinding, the grinding member for the fine grinding is not limited to the grinding whetstone 290.

(Gettering layer forming unit)

The gettering layer forming unit 100 is configured to form a gettering layer on the rear surface W2 of the wafer W while removing, through a stress relief processing, a damage layer which is formed on the rear surface W2 of the wafer W when the rough grinding and the fine grinding are performed on the rear surface W2 of the wafer W. A configuration of this gettering layer forming unit 100 is substantially the same as that of the rough grinding unit 80 or the fine grinding unit 90. The gettering layer forming unit 100 is equipped with a polishing whetstone, a base, a spindle and a driver. Here, however, a particle size of the polishing whetstone 300 is smaller than those of the grinding whetstones 280 and 290. By rotating the chuck 200 and the polishing whetstone 300 respectively while keeping the rear surface W2 of the wafer W held by the chuck 200 in contact with a ¼ arc portion of the polishing whetstone 300, the rear surface W2 of the wafer W is polished.

Further, though dry polishing is performed in the gettering layer forming unit 100 according to the present exemplary embodiment, the exemplary embodiment is not limited thereto. By way of example, the rear surface W2 may be polished while supplying a polishing liquid, for example, water to the rear surface W2 of the wafer W.

(Tape Thickness Measuring Unit)

Figure 9A:
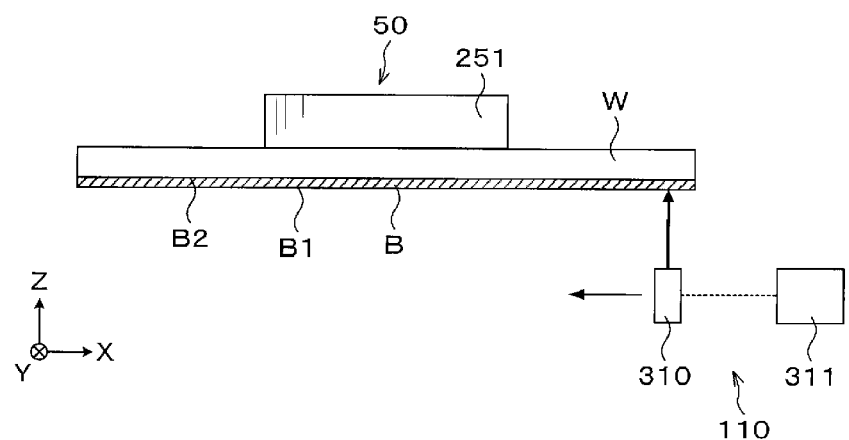
FIG. 9A and FIG. 9B are explanatory diagrams illustrating a schematic configuration of a tape thickness measuring unit.
Figure 9B:
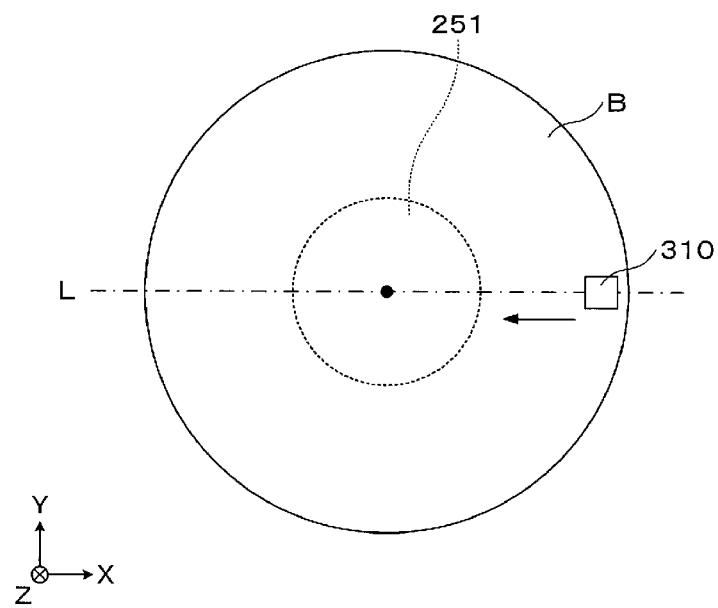

As shown in FIG. 9A and FIG. 9B, in the tape thickness measuring unit 110, a thickness of the protective tape B on the wafer W held by the transfer arm 251 of the transfer unit 50 is measured. That is, the tape thickness measuring unit 110 is configured to measure the thickness of the protective tape B of the wafer W which is being transferred from the alignment unit 60 to the chuck 200 placed at the first processing position P1.

As the tape thickness measuring unit 100, a measurement device configured to measure the thickness of the protective tape B without coming into contact with the protective tape B is used. For example, a spectral interferometer may be used. As shown in FIG. 9A, the tape thickness measuring unit 110 is equipped with a sensor 310 and a calculator 311. The sensor 310 irradiates light having a preset wavelength range, for example, laser light to the protective tape B, and receives reflection light reflected from a front surface B1 of the protective tape B and reflection light reflected from a rear surface B2 of the protective tape B. The calculator 311 calculates the thickness of the protective tape B based on a phase difference between the two reflection lights received by the sensor 310.

As depicted in FIG. 9B, the sensor 310 is configured to be moved by a moving mechanism (not shown) along a measurement line L which extends along a diameter of the protective tape B. As the sensor 310 is moved from one end of the protective tape B to the other end thereof, the tape thickness measuring unit 110 is capable of measuring a thickness distribution of the protective tape B in a diametrical direction.

Figure 10:
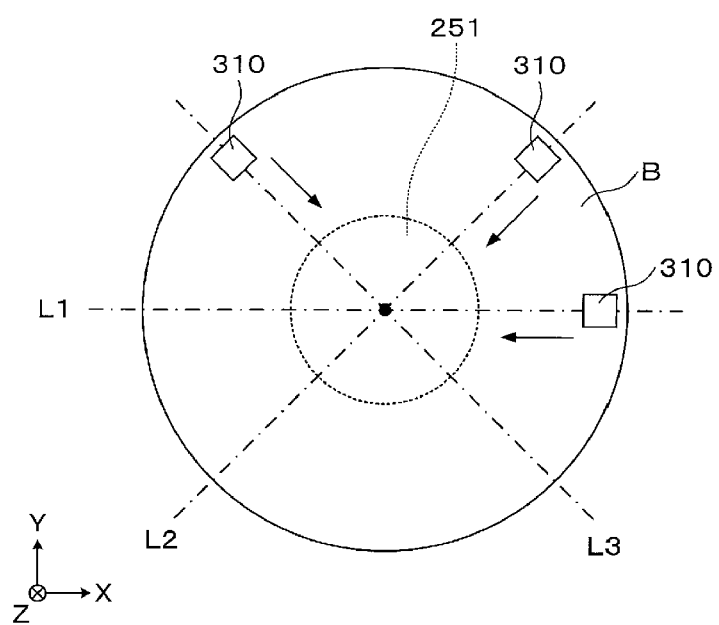
FIG. 10 is an explanatory diagram illustrating a schematic configuration of a tape thickness measuring unit according to another exemplary embodiment.

Further, as shown in FIG. 10, the tape thickness measuring unit 110 may be equipped with a plurality of sensors 310. These sensors 310 are respectively configured to be movable along measurement lines L1 to L3 which extend along the diameter of the protective tape B. In this configuration, the tape thickness measuring unit 110 is capable of measuring thickness distributions of the protective tape B along the respective measurement lines L1 to L3. By averaging these thickness distributions along the measurement lines L1 to L3, the thickness distribution of the protective tape B is obtained.

Furthermore, though the spectral interferometer is used as the tape thickness measuring unit 110 in the present exemplary embodiment, the configuration of the tape thickness measuring unit 110 is not limited thereto, and any of various kinds of measurement devices may be used as long as the thickness of the protective tape B can be measured.

Figure 11A:
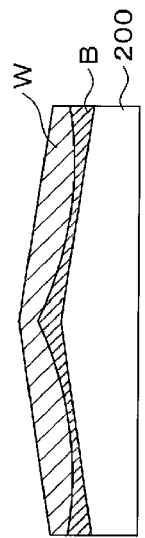
FIG. 11A to FIG. 11D are explanatory diagrams illustrating states in which a thickness of a protective tape is non-uniform within a surface thereof.
Figure 11C:
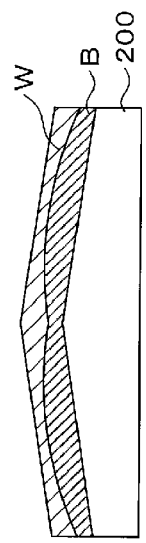
Figure 11B:
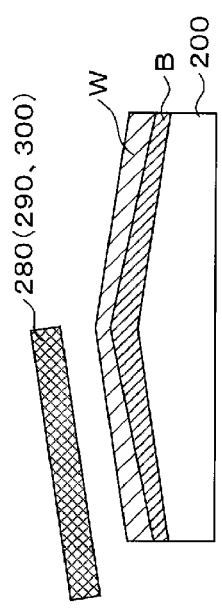
Figure 11D:
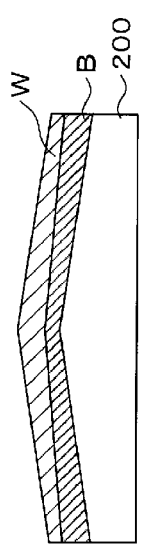

Here, the purpose of measuring the thickness of the protective tape B by the tape thickness measuring unit 110 in the present exemplary embodiment will be explained. As shown in FIG. 11A to FIG. 11D, the thickness of the protective tape B may be non-uniform within the surface thereof. FIG. 11A illustrates a case where a central portion of the protective tape B is thickener than both end portions thereof; FIG. 11B, a case where the central portion of the protective tape B is thinner than both ends portions thereof; FIG. 11C, a case where, on a half-surface of the protective tape B, a central portion is curved in a recessed shape; FIG. 11D, a case where, on the half-surface of the protective tape B, the central portion is curved in a protruding shape.

In these cases, if the rear surface W2 of the wafer W is ground and polished in the rough grinding unit 80, the fine grinding unit 90 and the gettering layer forming unit 100 in sequence, a relative thickness which is a sum of a thickness of the wafer W and the thickness of the protective tape B becomes uniform within the surface thereof. As a result, the thickness of the wafer W becomes non-uniform within the surface thereof.

Thus, prior to performing the rough grinding of the rear surface W2 of the wafer W in the rough grinding unit 80, the thickness of the protective tape B is measured in the tape thickness measuring unit 110. Then, based on a measurement result, the inclination of the chuck 200 is adjusted by the adjusting device 205. At this time, the inclination of the chuck 200 in the rough grinding unit 80, the inclination of the chuck 200 in the fine grinding unit 90 and the inclination of the chuck 200 in the gettering layer forming unit 100 are respectively adjusted.

Figure 12A:
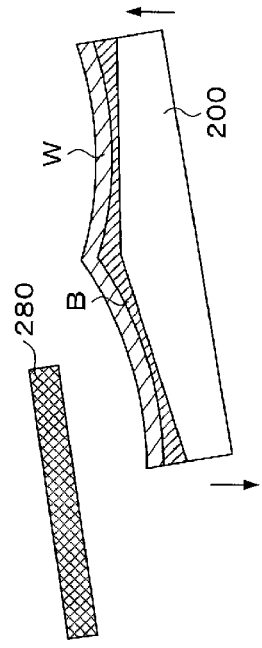
FIG. 12A to FIG. 12D are explanatory diagrams illustrating states in which an inclination of the chuck is adjusted to resolve the non-uniformity of the thickness of the protective tape shown in FIG. 11A to FIG. 11D.
Figure 12C:
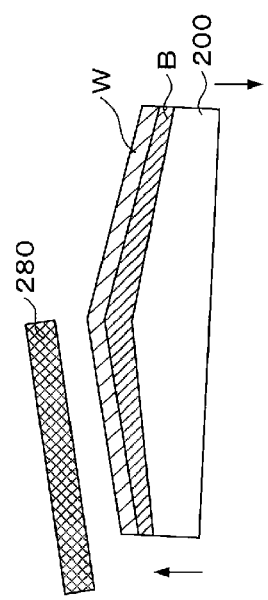
Figure 12B:
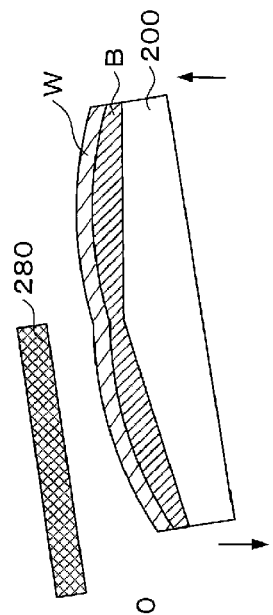
Figure 12D:
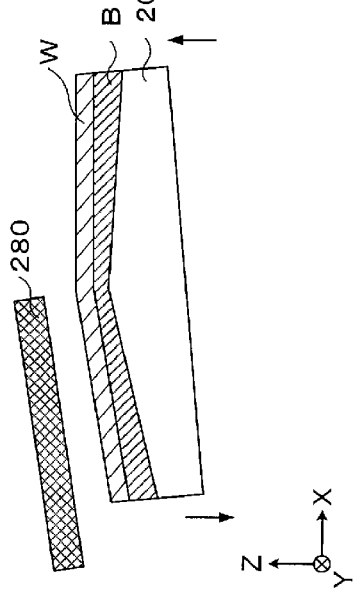

Below, an example where the inclination of the chuck 200 is adjusted in the rough grinding unit 80 will be elaborated. By way of example, for the protective tape B shown in FIG. 11A, the chuck 200 is tilted by raising an end of the chuck 200 near the grinding whetstone 280, as shown in FIG. 12A. For the protective tape B shown in FIG. 11B, the chuck 200 is tilted by lowering the end of the chuck 200 near the grinding whetstone 280, as shown in FIG. 12B. For the protective tape B shown in FIG. 11C, by lowering the end of the chuck 200 near the grinding whetstone 280 as shown in FIG. 12C, the chuck 200 is tilted such that a leading end of the grinding whetstone 280 comes into contact with a central portion (recessed portion) of the half-surface of the wafer W. For the protective tape B shown in FIG. 11D, by lowering the end of the chuck 200 near the grinding whetstone 280 as shown in FIG. 12D, the chuck 200 is tilted such that the leading end of the grinding whetstone 280 comes into contact with a central portion (recessed portion) of the whole surface of the wafer W. That is, by raising an elevation angle of the grinding whetstone 280 by tilting the chuck 200, the grinding whetstone 280 is allowed to easily come into contact with the central portion and the peripheral portion of the whole surface of the wafer W. In this way, the thickness of the wafer W after the grinding and the polishing of the rear surface W2 of the wafer W can be uniform within the surface thereof.

(Relative Thickness Measuring Unit)

The relative thickness measuring unit 120 is provided in each of the rough grinding unit 80, the fine grinding unit 90, and the gettering layer forming unit 100. In the following, the relative thickness measuring unit 120 provided in the rough grinding unit 80 will be explained.

Figure 13:
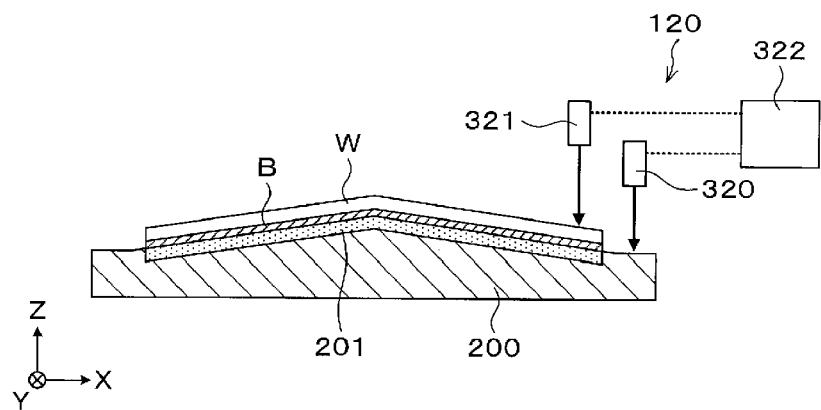
FIG. 13 is an explanatory diagram illustrating a schematic configuration of a relative thickness measuring unit.

As depicted in FIG. 13, in the relative thickness measuring unit 120, the relative thickness, which is the sum of the thickness of the wafer W and the thickness of the protective tape B, is measured for the wafer W which is being ground in the rough grinding unit 80. The relative thickness measuring unit 120 is equipped with a first sensor 320, a second sensor 321 and a calculator 322.

By way of example, a laser displacement meter may be used as the first sensor 320. The first sensor 320 does not come into contact with the chuck 200 and is configured to measure a position (height) of a front surface of the chuck 200 where no porous 201 is provided. Here, if laser light is irradiated to the porous 201, the laser light is absorbed by the porous 201 and not to be reflected. This is why the position where no porous 201 is provided is measured. This surface of the chuck 200 is regarded as a reference surface.

The second sensor 321 may also be a laser displacement meter, for example. The second sensor 321 does not come into contact with the wafer W and is configured to measure a position (height) of the rear surface W2 of the wafer W. In the present exemplary embodiment, although the first sensor 320 and the second sensor 321 are the laser displacement meters, the present exemplary embodiment is not limited thereto, and any of various kinds of measurement device capable of measuring a position of a measurement target in a non-contact manner can be used.

The calculator 322 is configured to calculate the relative thickness by subtracting the position of the front surface of the chuck 200 measured by the first sensor 320 from the position of the rear surface W2 of the wafer W measured by the second sensor 321.

The relative thickness is measured by the relative thickness measuring unit 120 while the rear surface W2 of the wafer W is being roughly ground in the rough grinding unit 80. A measurement result of the relative thickness measuring unit 120 is outputted from the calculator 322 to a controller 340 to be described later. The controller 340 monitors the relative thickness measured in the relative thickness measuring unit 120 and controls the rough grinding unit 80 such that the rough grinding is stopped when the relative thickness reaches a preset thickness. By using the relative thickness measuring unit 120 in this way, an end point (termination) of the rough grinding can be found.

Further, as mentioned above, the relative thickness measuring unit 120 is provided in the fine grinding unit 90 and the gettering layer forming unit 100 as well. The relative thickness measuring unit 120 measures the relative thickness in each unit and is thus capable of finding an end point of the fine grinding and an end point of the polishing in the gettering layer formation.

Further, the relative thickness measuring unit 120 of the present exemplary embodiment is capable of measuring the relative thickness without coming into contact with the wafer W and the chuck 200. Here, if a contact type measurement device is used as in conventional cases, that is, if the relative thickness is measured in a state that the measurement device is in contact with the rear surface W2 of the wafer W, the contract portion is rubbed to have a flaw. Further, depending on a device formed on the front surface of the wafer W, such a contact type measurement device may not be used. On this ground, the relative thickness measuring unit 120 of the present exemplary embodiment has advantages.

Figure 14:
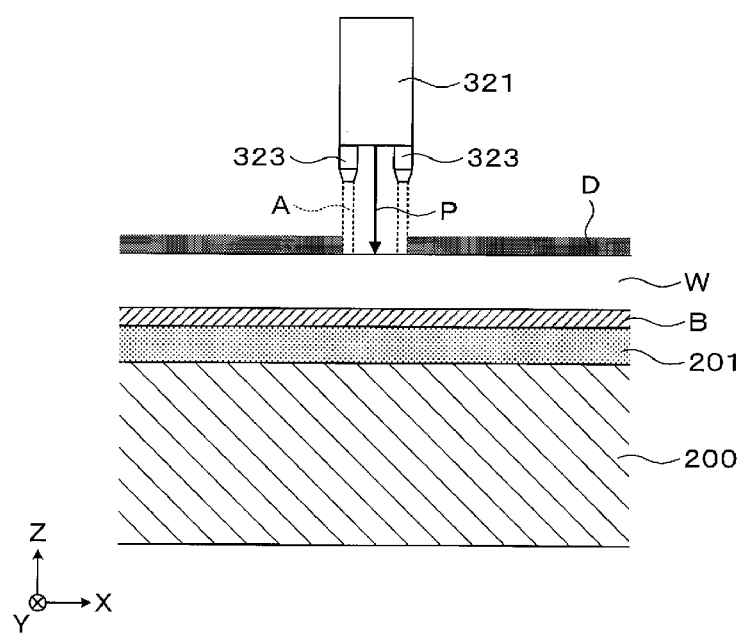
FIG. 14 is an explanatory diagram illustrating a schematic configuration of a relative thickness measuring unit according to another exemplary embodiment.

Here, in the rough grinding unit 80 and the fine grinding unit 90, the rear surface W2 of the wafer W is ground while supplying water as a grinding liquid onto the rear surface W2. Accordingly, a water layer D is formed on the rear surface W2 of the wafer W, as depicted in FIG. 14. In such a case, when the laser light is irradiated to the rear surface W2 from the second sensor 321, the water layer D or air bubbles included in the water layer D may become noises, rendering it difficult to measure the position of the rear surface W2 of the wafer W accurately.

Thus, it is desirable to provide a nozzle 323 as a fluid supply at a bottom surface of the second sensor 321. The nozzle 323 is configured to jet, for example, air A as a fluid along an optical path P of the laser light from the second sensor 321 to surround the optical path P. In such a case, the air A serves as a wall and blows the water layer D away, so that a spot (optical axis spot) of the rear surface W2 where the laser light is irradiated to and reflected from can be set in a dry environment. Thus, without being affected by the water layer D, the position of the rear surface W2 can be measured by the second sensor 321 more accurately.

Furthermore, the fluid jetted from the nozzle 323 may not be limited to the air. For example, water, which is the same as the water layer D, may be used. In such a case, a column of water is formed from the second sensor 321 to the rear surface W2. Since a refractive index of the laser light does not change between the water jetted from the nozzle 323 and the water layer D, the position of the rear surface W2 can be measured more accurately.

(Cleaning Apparatus)

The cleaning apparatus 31 shown in FIG. 1 is configured to clean the rear surface W2 of the wafer W which is ground and polished by the processing apparatus 30. To elaborate, while rotating the wafer W held by a spin chuck 330, a cleaning liquid, for example, pure water is supplied onto the rear surface W2 of the wafer W. The supplied cleaning liquid is diffused on the rear surface W2 of the wafer W, so that the rear surface W2 is cleaned.

(Controller)

The above-described substrate processing system 1 is equipped with the controller 340 as shown in FIG. 1. The controller 340 is, for example, a computer and includes a program storage (not shown). A program for controlling a processing performed on the wafer W in the substrate processing system 1 is stored in the program storage. Further, the program storage also stores therein a program for implementing a wafer processing to be described later in the substrate processing system 1 by controlling the above-described various processing apparatuses and a driving system such as the transfer devices. Further, the programs may be recorded in a computer-readable recording medium H such as a hard disk (HD), a flexible disk (FD), a compact disk (CD), a magnet optical disk (MO) or a memory card, and may be installed from this recording medium H to the controller 340.

(Wafer Processing)

Figure 15:
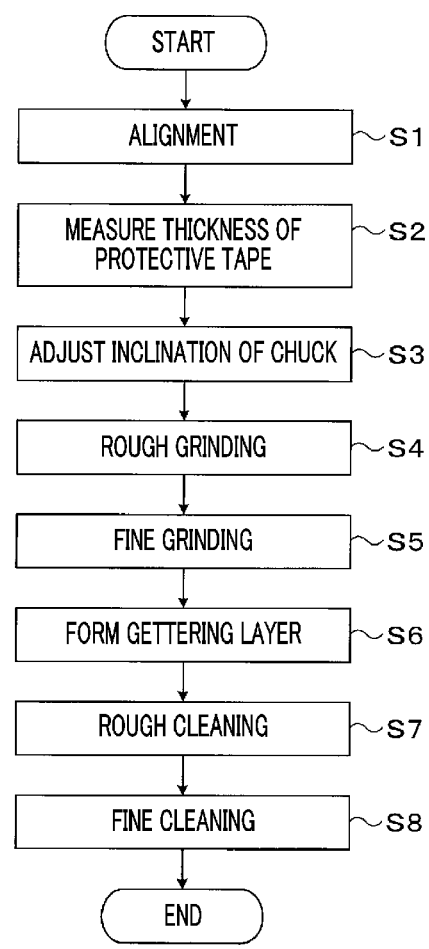
FIG. 15 is a flowchart showing major processes of a wafer processing.

Now, a wafer processing performed by using the substrate processing system 1 having the above-described configuration will be discussed. FIG. 15 is a flowchart illustrating an example of major processes of this wafer processing.

First, a cassette C accommodating therein a plurality of wafers W is placed on the cassette placing table 10 of the carry-in/out station 2. To suppress a deformation of the protective tape B, each wafer W is accommodated in the cassette C such that the front surface of the wafer W to which the protective tape B is attached faces upwards.

Then, a wafer W is taken out of the cassette C and transferred into the processing apparatus 30 of the processing station 3 by the wafer transfer device 22. At this time, the front surface and the rear surface of the wafer W are inverted by the transfer arm 23 such that the rear surface W2 of the wafer W faces upwards.

The wafer W transferred into the processing apparatus 30 is delivered onto the spin chuck 261 of the alignment unit 60. Then, a direction of the wafer W in the horizontal direction is adjusted by the alignment unit 60 (process S1 of FIG. 15).

Subsequently, while the wafer W is being transferred by the transfer unit 50, the thickness of the protective tape B is measured by the tape thickness measuring unit 110 (process S2 of FIG. 15). Then, based on the measurement result of the thickness of the protective tape B, the inclination of the chuck 200 in the rough grinding unit 80, the inclination of the chuck 200 in the fine grinding unit 90 and the inclination of the chuck 200 in the gettering layer forming unit 100 are individually adjusted by the adjusting device 205 (process S3 of FIG. 15).

By way of example, for the protective tape B shown in FIG. 11A to FIG. 11D, by adjusting the inclination of the chuck 200 as shown in FIG. 12A to FIG. 12D, the thickness of the wafer W after being ground and polished can be controlled to be uniform within the surface thereof. Meanwhile, in case that the protective tape B has, on the half-surface of the wafer W, a wave shape having a multiple number of protrusions and recesses, the thickness of the wafer W cannot be uniform just by adjusting the inclination of the chuck 200. That is, only by adjusting how the grinding whetstones 280 and 290 and the polishing whetstone 300 come into contact with the rear surface W2 of the wafer W, the thickness of the wafer W cannot be uniform. In such a case, a subsequent grinding and polishing processing upon this wafer W is stopped. Then, the wafer W is returned back into the cassette C of the cassette placing table 10 by the wafer transfer device 22 to be collected.

Further, in the present exemplary embodiment, though the inclination of the chuck 200 of each of the rough grinding unit 80, the fine grinding unit 90 and the gettering layer forming unit 100 is adjusted, the inclination of the chuck 200 of only the rough grinding unit 80 may be adjusted.

Subsequently, the wafer W is delivered onto the chuck 200 at the first processing position P1 by the transfer unit 50. Thereafter, by rotating the turntable 40 by 90 degrees in the counterclockwise direction, the chuck 200 is moved to the second processing position P2. Then, the rear surface W2 of the wafer W is roughly ground by the rough grinding unit 80 (process S4 of FIG. 15). As the inclination of the chuck 200 is appropriately adjusted based on the measurement result of the tape thickness measuring unit 110, the wafer W can be ground to have a uniform thickness within the surface thereof. Furthermore, since the end point of the rough grinding is investigated based on the measurement result of the relative thickness measuring unit 120, the wafer W can be ground to have the appropriate thickness. Furthermore, a grinding amount by the rough grinding is set based on the thickness of the wafer W before being thinned and the required thickness of the wafer W after being thinned.

Thereafter, the turntable 40 is further rotated by 90 degrees in the counterclockwise direction, and the chuck 200 is moved to the third processing position P3. Then, the rear surface W2 of the wafer W is finely ground by the fine grinding unit 90 (process S5 of FIG. 15). At this time, since the inclination of the chuck 200 is appropriately adjusted based on the measurement result of the tape thickness measuring unit 110, the wafer W can be ground to have a uniform thickness within the surface thereof. Furthermore, by finding the end point of the fine grinding based on the measurement result of the relative thickness measuring unit 120, the wafer W can be ground to have the appropriate thickness. The wafer W is ground up to the thickness after being thinned, which is required as a product.

Thereafter, by further rotating the turntable 40 by 90 degrees in the counterclockwise direction, the chuck 200 is moved to the fourth processing position P4. Then, while performing the stress relief processing, the gettering layer is formed on the rear surface W2 of the wafer W by the gettering layer forming unit 100 (process S6 of FIG. 15). At this time, since the inclination of the chuck 200 is appropriately adjusted based on the measurement result of the tape thickness measuring unit 110, the wafer W can be polished to have a uniform thickness within the surface thereof. Furthermore, since the end point of the polishing is investigated based on the measurement result of the relative thickness measuring unit 120, the wafer W can be polished to have the appropriate thickness.

Afterwards, by further rotating the turntable 40 by 90 degrees in the counterclockwise direction or 270 degrees in the clockwise direction, the chuck 200 is moved to the first processing position P1. Then, the rear surface W2 of the wafer W is cleaned by the cleaning liquid in the cleaning unit 70 (process S7 of FIG. 15).

Subsequently, the wafer W is transferred into the cleaning apparatus 31 by the wafer transfer device 22. In the cleaning apparatus 31, the rear surface W2 of the wafer W is cleaned by the cleaning liquid (process S8 of FIG. 15). The cleaning of the rear surface W2 of the wafer W is also performed in the cleaning unit 70 of the processing apparatus 30. In the cleaning unit 70, however, a rotation speed of the wafer W is low, and the cleaning is performed to remove contaminants only to some degree, for example, to the extent that the transfer arm 23 of the wafer transfer device 22 is not contaminated. Meanwhile, in the cleaning apparatus 31, the rear surface W2 of this wafer W is further cleaned to a required degree of cleanness.

Then, the wafer W after being subjected to all the required processings is transferred back into the cassette C on the cassette placing table 10 by the wafer transfer device 22. Then, a series of the wafer processings in the substrate processing system 1 is ended.

According to the present exemplary embodiment as described above, since the thickness of the protective tape B is measured in the tape thickness measuring unit 110 before the rear surface W2 of the wafer W is roughly ground in the rough grinding unit 80, the inclination of the chuck 200 is adjusted based on this measurement result, and the way how the grinding whetstones 280 and 290 and the polishing whetstone 300 come into contact with the rear surface W2 of the wafer W can be adjusted. Thus, even if the thickness of the protective tape B is non-uniform within the surface thereof, the thickness of the wafer W after being subject to the grinding and the polishing can be uniform within the surface thereof.

Conventionally, to uniform the thickness of the wafer W, a feedback control, in which the thickness of the wafer W is actually measured after the fine grinding and a processing condition for the grinding processing is corrected based on the measurement result, has been performed. In such a case, however, the grinding whetstone 290 needs to be separated from the fine grinding unit 90, and a sensor for measuring the thickness needs to be installed. Thus, it takes time to complete the grinding processing. In the present exemplary embodiment, however, since the thickness of the protective tape B is measured and the inclination of the chuck 200 is adjusted before the grinding processing, the time for the grinding processing can be shortened. Accordingly, the throughput of the wafer processing can be improved.

Furthermore, even if the inclination of the chuck 200 is adjusted as stated above, the rotation shaft 210 at the driven side and the driving unit 220 at the driving side are operated independently because the hollow portion 236 is formed in the driven pulley 231 of the rotating device 204. That is, though the rotational driving force by the driving unit 220 is appropriately delivered to the rotation shaft 210, the inclination of the chuck 200 (inclination of the rotation shaft 210) is not delivered to the driving unit 220. Therefore, the chuck 200 can be rotated appropriately.

Further, since the relative thickness is individually measured by the relative thickness measuring unit 120 during the rough grinding in the rough grinding unit 80, during the fine grinding in the fine grinding unit 90 and during the polishing in the gettering layer forming unit 100, the end points of the rough grinding, the fine grinding and the polishing can be found. Therefore, the wafer W can be ground and polished to have the appropriate thickness.

Moreover, according to the above-described exemplary embodiment, the rough grinding of the rear surface of the wafer W in the rough grinding unit 80, the fine grinding of the rear surface of the wafer W in the fine grinding unit 90, the formation of the gettering layer in the gettering layer forming unit 100, and the cleaning of the rear surface of the wafer W in the cleaning unit 70 and the cleaning apparatus 31 can be performed on a plurality of wafers W continuously in the single substrate processing system 1. Therefore, the wafer processing can be performed efficiently within the single substrate processing system 1, so that a throughput can be improved.

<Other Examples of Tape Thickness Measuring Unit>

Now, other examples of the tape thickness measuring unit 110 will be described. The tape thickness measuring unit 110 can be placed at any position as long as it is capable of performing the thickness measurement before the rear surface W2 of the wafer W is roughly ground in the rough grinding unit 80. That is, the tape thickness measuring unit 110 can be placed at any position in a wafer transfer path ranging from the carry-in/out station 2 to the rough grinding unit 80.

First Modification Example

Figure 16:
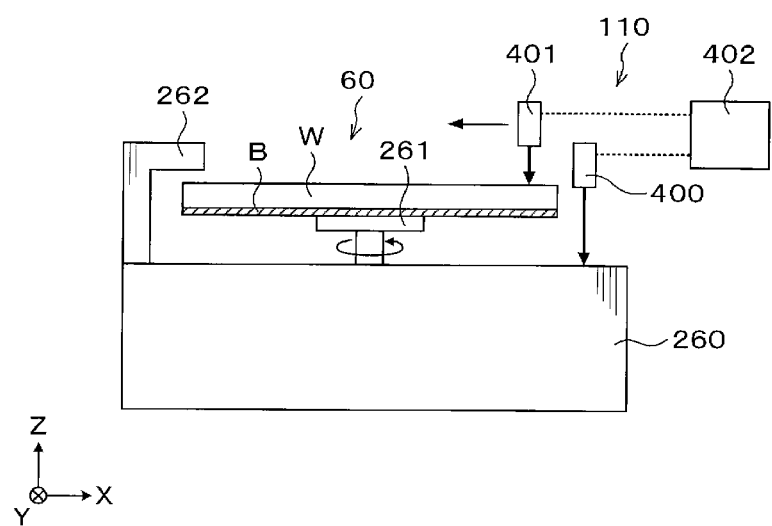
FIG. 16 is an explanatory diagram illustrating a schematic configuration of the tape thickness measuring unit according to another exemplary embodiment.

As depicted in FIG. 16, the tape thickness measuring unit 110 may be provided in the alignment unit 60. This tape thickness measuring unit 110 is equipped with a first sensor 400, a second sensor 401 and a calculator 402.

The first sensor 400 may be, by way of example, a laser displacement meter. The first sensor 400 is configured to measure a position (height) of a front surface of the base 260. This front surface of the base 260 is regarded as a reference surface.

The second sensor 401 may also be, for example, a laser displacement meter. The second sensor 401 is configured to measure a position (height) of the rear surface W2 of the wafer W. Further, in the present exemplary embodiment, though the laser displacement meters are used as the first sensor 400 and the second sensor 401, the present exemplary embodiment is not limited thereto, and any of various kinds of measurement devices capable of measuring a position of a measurement target in a non-contact manner can be used.

The calculator 402 calculates the thickness of the protective tape B by subtracting, from the position of the rear surface W2 of the wafer W measured by the second sensor 401, the position of the front surface of the base 260 measured by the first sensor 400 and a sum of a previously investigated thickness of the wafer W and a distance between a front surface of the spin chuck 261 and the front surface of the base 260.

Further, in the present first modification example, the second sensor 401 may measure a position of the rear surface W2 of the wafer W after measuring a position of the front surface of the spin chuck 261, for example. In the calculator 402, the relative thickness is calculated by subtracting the position of the front surface of the spin chuck 261 from the position of the rear surface W2 of the wafer W, and the thickness of the protective tape B is calculated by subtracting the previously investigated thickness of the wafer W from the relative thickness. In such a case, however, it is desirable that the spin chuck 261 has the same size as the wafer W when viewed from the top.

Moreover, though the thickness of the protective tape B is measured by using the first sensor 400, the second sensor 401 and the calculator 402 in the first modification example, the thickness of the protective tape B may be directly measured by using, for example, a spectral interferometer. In such a case, light having a wavelength range capable of penetrating the wafer W, for example, infrared light is used.

Second Modification Example

Figure 17:
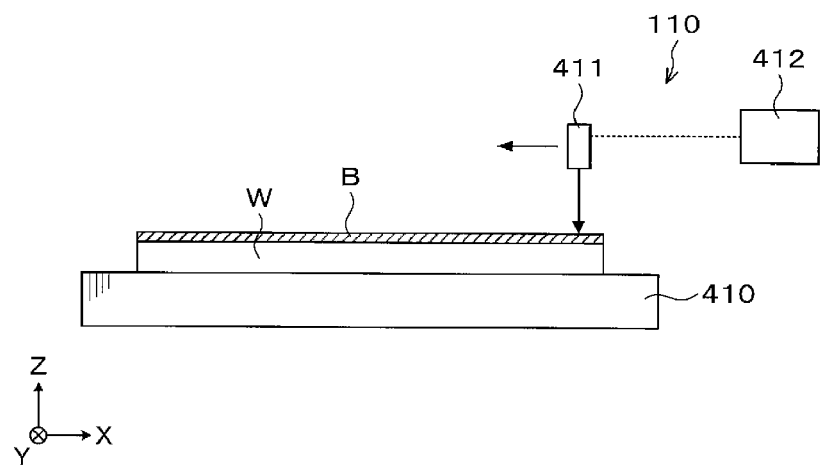
FIG. 17 is an explanatory diagram illustrating a schematic configuration of the tape thickness measuring unit according to another exemplary embodiment.

The tape thickness measuring unit 110 may be provided at an outside of the processing apparatus 30. In such a configuration, the tape thickness measuring unit 110 is connected to, for example, the wafer transfer area 20. As depicted in FIG. 17, the tape thickness measuring unit 110 has a placing table 410 configured to place and hold the wafer W thereon. In case that the wafer W is held by the placing table 410, a spectral interferometer equipped with a sensor 411 and a calculator 412 is used as the tape thickness measuring unit 110. The sensor 411 and the calculator 412 have the same configurations as the sensor 310 and the calculator 311 of the above-described exemplary embodiment. Further, in case that the protective tape B is held by the placing table 410 (in case that the front surface and the rear surface of the wafer W are reverse to the shown example), sensors (not shown) and a calculator (not shown) having the same configurations as the first and second sensors 400 and 401 and the calculator 402 of the above-described exemplary embodiment are used in the tape thickness measuring unit 110. In any cases, the thickness of the protective tape B can be measured in the tape thickness measuring unit 110.

In any of the above-described first and second modification examples, since the thickness of the protective tape B can be measured before the rough grinding in the rough grinding unit 80 is performed, the same effects as obtained in the above-described exemplary embodiment can be achieved.

<Other Examples of Chuck Rotating Device>

Figure 18A:
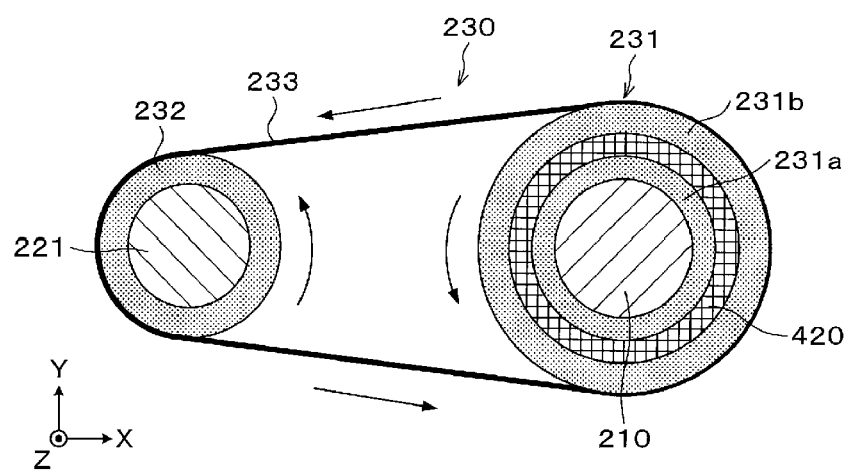
FIG. 18A and FIG. 18B are explanatory diagrams schematically illustrating a driving force transmitter according to another exemplary embodiment.
Figure 18B:
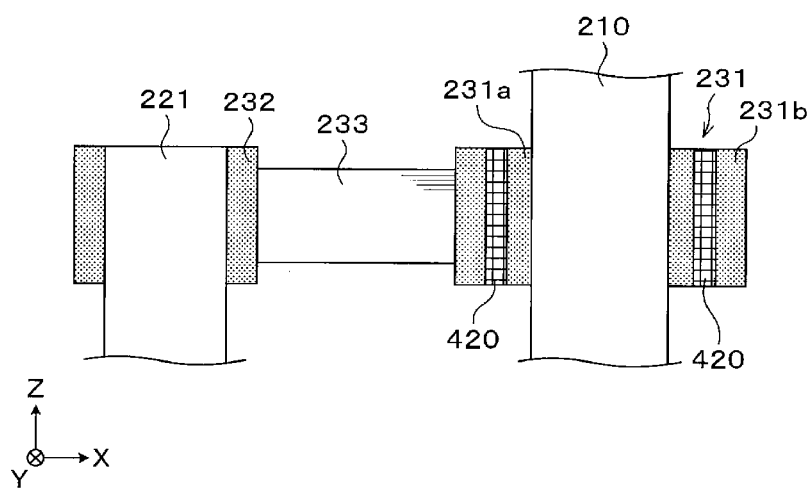

In the above-described exemplary embodiment shown in FIG. 4A and FIG. 4B, the hollow portion 236 is formed between the inner driven pulley 231a and the outer driven pulley 231b in the driving force transmitter 230 of the rotating device 204. However, as illustrated in FIG. 18A and FIG. 18B, a flexible member 420 may be filled between the inner driven pulley 231a and the outer driven pulley 231b instead of the hollow portion 236. In such a configuration, the inner magnet 234 and the outer magnet 235 are omitted.

The flexible member 420 is not particularly limited as long as it delivers the rotational driving force by the driving unit 220 to the rotation shaft 210 but does not deliver the inclination of the rotation shaft 210 to the driving unit 220. By way of non-limiting example, a plurality of pins having flexibility may be used as the flexible member 420, or a diaphragm (membrane) may be used as the flexible member 420 and this diaphragm may be transformed. By using the flexible member 420, the same effects as obtained in the above-described exemplary embodiments can be achieved.

Moreover, in the rotating device 204 according to the above-described exemplary embodiments, the rotation shaft 210 and the driving unit 220 are provided independently. However, a driving unit (not shown) of a direct drive type, for example, may be provided at the supporting table 211 of the rotation shaft 210.

<Other Examples of Chuck Adjusting Device>

In the above-described exemplary embodiment shown in FIG. 3, the inclination of the chuck 200 is adjusted by the adjusting device 205. However, inclinations of the grinding whetstones 280 and 290 and the polishing whetstone 300 may be adjusted instead, or both the inclination of the chuck 200 and the inclinations of the grinding whetstones 280 and 290 and the polishing whetstone 300 may be adjusted.

<Other Exemplary Embodiments of Substrate Processing System>

In the substrate processing system 1 according to the above-described exemplary embodiment shown in FIG. 1, the gettering layer forming unit 100 is provided within the processing apparatus 30. However, a gettering layer forming apparatus (not shown) having the same configuration as the gettering layer forming unit 100 may be independently provided at the outside of the processing apparatus 30. In such a case, the processing apparatus 30 may include the rough grinding unit 80, a medium grinding unit (not shown) and the fine grinding unit 90.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

EXPLANATION OF CODES

According to the exemplary embodiments, the grinder can be brought into contact with the substrate appropriately even if the thickness of the protective tape is non-uniform within the surface thereof. Therefore, the substrate can be thinned to have the uniform thickness within the surface thereof.

We claim:

1. A substrate processing system configured to thin a substrate, the substrate processing system comprising:
a substrate holder configured to hold the substrate;
a grinder configured to perform a grinding of the substrate held by the substrate holder;
a rotation shaft connected to the substrate holder and configured to rotate the substrate holder;
a driving device provided independently from the rotation shaft and configured to apply a rotational driving force for rotating the substrate holder; and
a driving force transmitter configured to deliver the rotational driving force of the driving device to the rotation shaft and configured not to deliver an inclination of the rotation shaft to the driving device,
wherein the substrate is ground by bringing the grinder into contact with the substrate in a state that the rotation shaft is tilted,
wherein the driving force transmitter comprises:
a first driving force transmitter provided at a side of the rotation shaft; and
a second driving force transmitter provided at a side of the driving device,
wherein a hollow portion is formed between the first driving force transmitter and the second driving force transmitter, and wherein the substrate is ground by bringing the grinder into contact with the substrate in a state that the first driving force transmitter is tilted in the hollow portion.

2. The substrate processing system of claim 1, further comprising:
an adjustment device configured to adjust a relative inclination between the grinder and the substrate holder.

3. The substrate processing system of claim 2,
wherein the substrate holder comprises:
a chuck having a holding surface on which the substrate is placed;
a chuck table configured to hold the chuck; and
a base configured to support the chuck table,
wherein the adjustment device includes multiple adjustment members, and the multiple adjustment members are arranged on a same circumference at a peripheral portion of the base.

4. The substrate processing system of claim 3,
wherein the grinder comprises a rough grinder configured to roughly grind the substrate and a fine grinder configured to finely grind the substrate which is roughly ground by the rough grinder, and
the adjustment device adjusts at least an inclination of the substrate holder which holds the substrate being roughly ground by the rough grinder.

5. The substrate processing system of claim 3, wherein the adjustment device comprises a plurality of adjustment shafts configured to move a peripheral portion of the substrate holder in a vertical direction.

6. The substrate processing system of claim 1, further comprising:
a tape thickness measurement device,
wherein a protective tape is attached on a front surface of the substrate, and
the tape thickness measurement device is configured to measure a thickness of the protective tape before the substrate is ground by the grinder.

7. The substrate processing system of claim 6,
wherein the tape thickness measurement device measures the thickness of the protective tape along a diameter of the protective tape, and
the tape thickness measurement device measures the thickness of the protective tape without coming into contact with the substrate and the protective tape.

8. The substrate processing system of claim 7, further comprising:
a carry-in/out section configured to carry the substrate to/from an outside,
wherein the tape thickness measurement device is provided between the carry-in/out section and the substrate holder.

9. The substrate processing system of claim 8, further comprising:
an adjustment device configured to adjust a relative inclination between the grinder and the substrate holder based on a measurement result of the tape thickness measurement device before the substrate is held by the substrate holder.

10. The substrate processing system of claim 1, further comprising:
a relative thickness measurement device configured to measure a relative thickness, which is a sum of a thickness of the substrate and a thickness of a protective tape, during the grinding by the grinder without coming into contact with the substrate and the protective tape; and a controller configured to control the grinding by the grinder based on a measurement result of the relative thickness measurement device.

11. The substrate processing system of claim 10,
wherein the relative thickness measurement device comprises a first sensor configured to measure a position of a front surface of the substrate holder and a second sensor configured to measure a position of a rear surface of the substrate, and
the relative thickness is measured based on a measurement result of the first sensor and a measurement result of the second sensor.

12. The substrate processing system of claim 11,
wherein a porous body having multiple holes therein is provided on the front surface of the substrate holder, and
the first sensor measures a position on the front surface of the substrate holder where the porous body is not provided.

13. The substrate processing system of claim 11,
wherein the second sensor measures the position of the rear surface of the substrate by irradiating light to the rear surface thereof, and
the relative thickness measurement device comprises a fluid supply configured to supply a fluid along an optical path ranging from the second sensor to the rear surface of the substrate.

14. A substrate processing method of thinning a substrate, the substrate processing method comprising:
grinding, by using a grinder, the substrate held by a substrate holder,
wherein, in the grinding of the substrate, the substrate is ground by bringing the grinder into contact with the substrate while rotating the substrate held by the substrate holder by a rotation shaft connected to the substrate holder in a state that the rotation shaft is tilted,
a rotation driving force for rotating the substrate holder is applied by a driving device provided independently from the rotation shaft, and
the rotation driving force of the driving device is delivered to the rotation shaft by a driving force transmitter, and the driving force transmitter is configured not to deliver an inclination of the rotation shaft to the driving device,
wherein the driving force transmitter comprises:
a first driving force transmitter provided at a side of the rotation shaft; and
a second driving force transmitter provided at a side of the driving device,
wherein a hollow portion is formed between the first driving force transmitter and the second driving force transmitter, and
wherein in the grinding of the substrate, the substrate is ground by bringing the grinder into contact with the substrate in a state that the first driving force transmitter is tilted in the hollow portion.

15. The substrate processing method of claim 14,
wherein a relative inclination between the grinder and the substrate holder is adjusted in the grinding of the substrate.

16. The substrate processing method of claim 15, further comprising:
measuring a thickness of a protective tape before the grinding of the substrate,
wherein the protective tape is attached on a front surface of the substrate.

17. The substrate processing method of claim 15,
wherein, during the grinding in the grinding of the substrate, a relative thickness, which is a sum of a thickness of the substrate and a thickness of a protective tape, is measured by a relative thickness measurement device in a state that the relative thickness measurement device does not come into contact with the substrate and the protective tape; and
the grinding by the grinder is controlled based on a measurement result of the relative thickness measurement device.

18. A non-transitory computer-readable recording medium having stored thereon computer-executable instructions that, in response to execution, cause a substrate processing system to perform a substrate processing method of thinning a substrate,
wherein the substrate processing method comprises:
grinding, by using a grinder, the substrate held by a substrate holder,
wherein, in the grinding of the substrate, the substrate is ground by bringing the grinder into contact with the substrate while rotating the substrate held by the substrate holder by a rotation shaft connected to the substrate holder in a state that the rotation shaft is tilted,
a rotation driving force for rotating the substrate holder is applied by a driving device provided independently from the rotation shaft, and
the rotation driving force of the driving device is delivered to the rotation shaft by a driving force transmitter, and the driving force transmitter is configured not to deliver an inclination of the rotation shaft to the driving device,
wherein the driving force transmitter comprises:
a first driving force transmitter provided at a side of the rotation shaft; and
a second driving force transmitter provided at a side of the driving device,
wherein a hollow portion is formed between the first driving force transmitter and the second driving force transmitter, and
wherein in the grinding of the substrate, the substrate is ground by bringing the grinder into contact with the substrate in a state that the first driving force transmitter is tilted in the hollow portion.

19. A substrate processing system configured to thin a substrate, the substrate processing system comprising:
a substrate holder configured to hold the substrate;
a grinder configured to perform a grinding of the substrate held by the substrate holder;
a rotation shaft connected to the substrate holder and configured to rotate the substrate holder;
a driving device provided independently from the rotation shaft and configured to apply a rotational driving force for rotating the substrate holder; and
a driving force transmitter configured to deliver the rotational driving force of the driving device to the rotation shaft through a non-contact type magnet drive mechanism and configured not to deliver an inclination of the rotation shaft to the driving device,
wherein the substrate is ground by bringing the grinder into contact with the substrate in a state that the rotation shaft is tilted.

* * * * *